US00RE40783E

(19) United States
(12) Reissued Patent
Jo et al.

(10) Patent Number: US RE40,783 E
(45) Date of Reissued Patent: Jun. 23, 2009

(54) ADAPTIVE VARIABLE-LENGTH CODING AND DECODING METHODS FOR IMAGE DATA

(75) Inventors: Jae Moon Jo, Gyeonggi-do (KR); Jechang Jeong, Seoul (KR)

(73) Assignee: Samsung Electronics Co., Ltd, Suwon-si (KR)

(21) Appl. No.: 11/738,419

(22) PCT Filed: Dec. 16, 1994

(86) PCT No.: PCT/KR94/00177

§ 371 (c)(1), (2), (4) Date: Nov. 3, 1995

(87) PCT Pub. No.: WO95/17073

PCT Pub. Date: Jun. 22, 1995

Related U.S. Patent Documents

Reissue of:
(64) Patent No.: 5,793,897
Issued: Aug. 11, 1998
Appl. No.: 09/495,591
Filed: Dec. 16, 1994

U.S. Applications:
(62) Division of application No. 09/654,939, filed on Dec. 22, 2000, which is a division of application No. 09/638,796, filed on Aug. 11, 2000, now Pat. No. Re. 39,167.

(30) Foreign Application Priority Data

Dec. 16, 1993 (KR) ..... 93-28074
Dec. 15, 1994 (KR) ..... 94-34497

(51) Int. Cl.
*G06K 9/36* (2006.01)
*G06K 9/46* (2006.01)

(52) U.S. Cl. ..... 382/246; 382/239

(58) Field of Classification Search ..... 382/232, 382/233, 236, 238, 239, 244, 246, 248, 250, 382/251, 253, 270
See application file for complete search history.

(56) References Cited

U.S. PATENT DOCUMENTS

| | | | |
|---|---|---|---|
| 4,908,862 | A | 3/1990 | Kaneko et al. |
| 5,329,318 | A | 7/1994 | Keith |
| 5,377,051 | A | 12/1994 | Lane et al. |
| 5,402,244 | A | 3/1995 | Kim |
| 5,559,557 | A | 9/1996 | Kato |
| 5,982,437 | A | 11/1999 | Okazaki et al. |

FOREIGN PATENT DOCUMENTS

| | | | |
|---|---|---|---|
| EP | 0 469 835 | A | 2/1992 |
| EP | 0 536 630 | A | 4/1993 |
| EP | 0 542 474 | A | 5/1993 |
| GB | 2 267 410 | A | 12/1993 |

*Primary Examiner*—Phuoc Tran
(74) *Attorney, Agent, or Firm*—Sughrue Mion, PLLC

(57) ABSTRACT

An adaptive variable-length coding/decoding method performs an optimal variable-length coding and decoding depending on an intra mode/inter mode condition, quantization step size and a current zigzag scanning position, such that a plurality of variable-length coding tables having different patterns of a regular region and an escape region according to statistical characteristics of the run level data are set. One of the variable-length coding tables is selected according to mode, quantization step size and scanning position, and the orthogonal transform coefficients according to the selected variable-length coding table are variable-length-coded.

3 Claims, 7 Drawing Sheets

$T_1$ $T_2$ $T_3$

ADAPTIVE VARIABLE-LENGTH CODING AND DECODING METHODS FOR IMAGE DATA

Matter enclosed in heavy brackets [ ] appears in the original patent but forms no part of this reissue specification; matter printed in italics indicates the additions made by reissue.

*This is a Divisional of application Ser. No. 09/654,939 filed Dec. 22, 2000, which is a Divisional of U.S. application Ser. No. 09/638,796 filed Aug. 11, 2000, which is a reissue of U.S. Pat. No. 5,793,897, issued Aug. 11, 1998. The entire disclosures of the prior applications are considered part of the disclosure of the accompanying divisional application and are hereby incorporated by reference.*

*More than one reissue application has been filed for the reissue of U.S. Pat. No. 5,793,897 filed Nov. 3, 1995. The reissue applications are application Ser. No. 09/638,796 filed Aug. 11, 2000, now U.S. Reissue Patent RE39,167, application Ser. No. 09/654,939 filed Aug. 31, 2000, application Ser. No. 11/017,697 filed Dec. 22, 2004, application Ser. No. 11/017,698 filed Dec. 22, 2004, application Ser. No. 11/416,183 filed May 3, 2006, application Ser. No. 11/416,312 filed May 3, 2006, application Ser. No. 11/738,415 filed Apr. 20, 2007, and application Ser. No. 11/738,419 filed Apr. 20, 2007, which is the present application. Application Ser. No. 09/638,796 is a reissue of U.S. Pat. No. 5,793,897. Application Ser. No. 09/654,939 is a divisional application of U.S. Reissued Patent RE39,167. Application Ser. No. 11/017,697 is a divisional application of Ser. No. 09/654,939. Application Ser. No. 11/017,698 is a divisional application of Ser. No. 09/654,939. Application Ser. No. 11/416,183 is a divisional application of Ser. No. 11/017,697. Application Ser. No. 11/416,312 is a divisional application of Ser. No. 11/017,698. Application Ser. No. 11/738,415 is a divisional application of Ser. No. 09/654,939. Application Ser. No. 11/738,419, which is the present application, is a divisional application of Ser. No. 09/654,939. The entire disclosures of U.S. Pat. No. 5,793,897, U.S. Reissued Patent RE39,167, application Ser. No. 09/654,939 are hereby incorporated by reference.*

TECHNICAL FIELD

The present invention relates to adaptive variablelength coding and decoding methods for digital image data, and more particularly, to adaptive variable-length coding and decoding methods which improve compression efficiency of transmission data by performing variable-length coding and decoding adaptively, according to statistical characteristics of image data.

BACKGROUND ART

Recently, in an apparatus for transmitting and receiving video and audio signals, a method by which the video and audio signals are coded to be digital signals to then be transmitted or stored in a memory and the digital signals are decoded to then be reproduced, has been widely adopted.

However, in the case of coding a video signal into digital data, the data quantity is large. Thus, in order to decrease the overall data quantity by removing redundant data contained in the digital video signal, discrete cosine transform (DCT) coding, differential pulse code modulation (DPCM), vector quantization, or variablelength coding (VLC) should be performed.

FIG. 1 is a schematic block diagram of a general coding system for image data. The apparatus includes means 11 and

12 for performing a DCT function with respect to an N×N block and for quantizing DCT coefficients, means 13 and 14 for variable-length-coding the quantized data and for further compressing data quantity, and means 15, 16, 17, 18, 19, A1, A2, SW1 and SW2 related to the inverse quantization and DCT operations with respect to the quantized data to then perform a motion compensation, which codes image data in an intra mode or inter mode.

FIG. 2 is a schematic block diagram of a general decoding system for image data. The apparatus decodes and reproduces the image data coded by coding system shown in FIG. 1.

The operation of the coding and decoding systems respectively shown in FIGS. 1 and 2 will be briefly described.

In FIG. 1, the video signal input through an input port 10 becomes a signal of a frequency domain in the units of N×N blocks in DCT 11, where although the magnitude of a block is generally $N_1 \times N_2$, it is assumed that $N_1 = N_2 = N$, for the sake of convenience. The energy of transform coefficients is chiefly concentrated in a low frequency domain. Data transforms for each block are performed by a discrete cosine transform. Walsh-Hadamard transform, discrete Fourier transform, or discrete sine transform method. Here, the transform coefficients are obtained by DCT operation.

Quantizer 12 changes the DCT coefficients into representative values of a constant level through a predetermined quantization process.

Variable-length encoder 13 variable-length-codes the representative values using their statistical characteristics, thereby further compressing the data.

Meanwhile, a quantization step size $Q_{SS}$, which is varied depending on the state (a fullness) of a buffer 14 wherein the variable-length-coded data is stored, controls quantizer 12 to thereby adjust a transmission bit rate. The quantization step size $Q_{SS}$ is also transmitted to a receiver side, to be used in a decoding system.

Also, in general, there are many similar portions between consecutive screens. Therefore, in the case of a screen having motion, a motion vector MV is obtained by estimating the motion, and data is compensated using the motion vector MV. Then, a differential signal between adjacently positioned screens becomes very small, thereby allowing transmission data to be more compressed.

In order to perform such motion compensation, an inverse quantizer ($Q^{-1}$) 15 shown in FIG. 1 inverse-quantizes the quantized data output from quantizer 12. Thereafter, the inverse-quantized data is inverse-DCT-operated in an inverse DCT means ($DCT^{-1}$) 16 to then be a video signal of a spatial domain. The video signal output from inverse DCT means 16 is stored in a frame memory 17 in frame units. Motion estimator 18 searches a block having the most similar pattern to that of an N×N block of input port 10 among the frame data stored in frame memory 17 and estimates the motion between blocks to obtain a motion vector MV. The motion vector MV is transmitted to a receiver side to be used in a decoding system and is simultaneously transmitted to a motion compensator 19.

Motion compensator 19 receives the motion vector MV from motion estimator 18 and reads out an N×N block corresponding to the motion vector MV from the previous frame data output from frame memory 17 to then supply the read N×N block to a subtractor A1 connected with input port 10. Then, subtractor A1 obtains the difference between the N×N block supplied to input port 10 and the N×N block having the similar pattern thereto supplied from motion compensator 19. The output data of subtractor A1 is coded and then transmitted to the receiver side, as described above. That is to say, initially, the video signal of one screen (intraframe) is coded wholly to then be transmitted. For the video signal of the following screen (interframe), only the differential signal due to the motion is coded to then be transmitted.

Meanwhile, the data whose motion is compensated in motion compensator 19 is summed with the video signal output from inverse DCT means 16 in an adder A2 and is thereafter stored in frame memory 17.

Refresh switches SW1 and SW2 are turned off at a certain interval (here, the period is one group of pictures or a GOP period) by a control means (not shown), so that an input video signal is coded into a PCM mode to then be transmitted in the case of an intraframe mode and so that only the differential signal is coded to then be transmitted in the case of an interframe mode, thereby refreshing cumulative coding errors for a constant period (one GOP). Also, a refresh switch SW3 allows the transmission errors on a channel to deviate from the receiver side within the constant time period (one GOP).

In this manner, the coded image data $V_c$ is transmitted to the receiver side to then be input to the decoding system shown in FIG. 2. The coded image data Vc is decoded through the reverse process to the coding process in a variable-length decoder 21. The data output from variable-length decoder 21 is inverse-quantized in an inverse quantizer 22. At this time, inverse quantizer 22 adjusts the magnitude of the output DCT coefficients depending on the quantization step size $Q_{SS}$ supplied from the encoding system.

An inverse DCT means 23 inverse-DCT-operates the DCT coefficients of a frequency domain, supplied from inverse quantizer 22, into the image data of a spatial domain.

Also, the motion vector MV transmitted from coding system shown in FIG. 1 is supplied to a motion compensator 24 of decoding system. Motion compensator 24 reads out the N×N block corresponding to the motion vector MV from the previous frame data stored in a frame memory 25, compensates the motion and then supplies the compensated N×N block to an adder A3. Then, adder A3 adds the inverse-DCT-operated DPCM data to the N×N block data supplied from motion compensator 24 to then output to a display.

FIGS. 3A, 3B and 3C schematically shown the process of coding image data. The sampling data of an N×N block shown in FIG. 3A is DCT-operated to be DCT coefficients of a frequency domain by the DCT method, etc., as shown in FIG. 3B. The DCT coefficients are quantized and are scanned in a zigzag pattern, to then be coded in the form of runlength and level-length, as shown in FIG. 3C.

While the scanning is performed from a low frequency component to a high frequency component in scanning the N×N block, as shown in FIG. 3C, a "run" and "level" and set as a pair expressed as [run, level], and is then coded.

Here, the run represents the number of 0's present between coefficients not being "0" among the quantized coefficients of an N×N block, and the level corresponds to the absolute value of the coefficient not being "0".

For example, in the case of an 8×8 block, the run is distributed from "0" to "63" and the level varies depending to the data value output from a quantizer. That is to say, if the quantized output value is indicated as an integer ranging from "−255" to "+255," the level has a value ranging from "1" to "+255." At this time, the positive or negative sign is expressed by an extra sign bit. In this manner, when a [run, level] pair is set as a symbol, if the run or level is large, the probability of the symbol is statistically very low.

Therefore, as shown in FIG. 4, the block is divided into a regular region and an escape region according to the probability of the symbol. For the regular region where the probability of the symbol is relatively high, a Huffman code is used in coding. For the escape region where the probability of the symbol is low, data of a predetermined fixed length is used in coding. Here, according to the Huffman code, the higher the probability of the symbol, the shorter the code is set, and vice versa.

Also, the escape sequence ESQ in which data of escape region is coded is composed of an escape code ESC, run, level and sign data S, each having a predetermined number of bits, as expressed in the following equation (1).

$$ESQ=ESC+RUN+L+S \quad (1)$$

For example, as described above, if the quantized value is from "−255" to "+255" in an 8×8 block, the escape sequence has a constant data length of 21 bits in total since the escape code data ESC is six bits, run data RUN is six bits, level data L is eight bits, and sign data S is one bit.

In this manner, according to the conventional variable-length coding method, since various extra information is also transmitted together with coded data and the escape sequence set by one variable-length coding table depending on the statistical characteristics of data has a constant fixed length, there is a limit in compressing data quantity by coding transmitted data.

Disclosure of the Invention

Therefore, it is an object of the present invention to provide an adaptive variable-length coding method which improves compression efficiency of data by selecting an optimal variable-length coding table among a plurality of variable-length coding tables according to the current scanning position and quantization step size while scanning in a zigzag pattern by block type, i.e., inter/intra mode.

It is another object of the present invention to provide a method for decoding data coded by the above adaptive variable-length coding method.

To accomplish the above object, there is provided an adaptive variable-length coding method according to the present invention whereby quantized orthogonal transform coefficients are scanned in a zigzag pattern, are DCT-operated to be [run, level] data and then are variable-length-coded in a coding system for image data, the method comprising the steps of:

setting a plurality of variable-length coding tables having different patterns of a regular region and an escape region according to statistical characteristics of the [run, level] data;

selecting one of the plurality of variable-length coding tables according to intra/inter mode information of the currently processed block, zigzag scanning position and quantization step size; and variable-length-coding the orthogonal transform coefficients according to the selected variable-length coding table.

In a decoding system for image data, the adaptive variable-length decoding method according to the present invention for decoding data coded by the adaptive variable-length coding method, comprises the steps of:

setting a plurality of variable-length decoding tables having different patterns of a regular region and an escape region according to statistical characteristics of the [run, level] data;

inputting intra/inter mode information transmitted from the coding system;

inputting quantization step size transmitted from the coding system;

decoding position information while zigzag-scanning by accumulating run values of [run, level] data;

selecting one of the plurality of variable-length decoding tables according to the intra/inter mode information, quantization step size and position information; and variable-length-decoding the data received according to the selected variable-length decoding table.

BRIEF DESCRIPTION OF THE DRAWINGS

FIGS. 6A and 6B illustrate a method for selecting a variable-length coding table partitioned by a predetermined number in the adaptive variable-length coding method according to the present invention, wherein FIG. 6A represents the intra mode and FIG. 6B represents the inter mode.

BEST MODE FOR CARRYING OUT THE INVENTION

Hereinbelow, a preferred embodiment of the present invention will be described with reference to the accompanying drawings.

In the adaptive variable-length coding method according to the present invention, a plurality of variable-length coding tables are used. The table is selected in accordance with a block type, quantization step size and a current scanning position while scanning a block in a zigzag pattern. This selection is in accordance with the statistical characteristics of [run, level] data which vary depending on block type, i.e., intra mode/inter ode or luminance signal/color signal, quantization step size and a current zigzag scanning position, and which will be described in more detail.

The inter mode for coding the differential signal between the current block data and motion compensated block data generates most of the DCT coefficients as "0" but scarcely generates larger values, compared to the intra mode for coding input block image data sequentially. This is because the variation in a motion compensation estate error thereof is typically smaller than that of the original video signal.

Also, the statistical characteristics of color which depend on the decimation in the spatial domain and narrow bandwidth are different from those of luminance.

Therefore, in accordance with intra/inter mode and luminance/color information, there may be four block types, i.e., (intra, luminance), (intra, color), (inter, luminance) and (inter, color). Hoverer, for the block type in the present invention, the luminance/color information is excluded and only the intra/inter mode is considered, because the color statistics are dependent on the downsampling structure of the color signal.

Also, in the case of a large quantization step size, DCT coefficients are not high in the high frequency components and many are generated as "0's" while the quantizer scans in a zigzag pattern. That is to say, in order to utilize the human visual characteristics, the DCT coefficients are divided into primary weighting matrices. Since the weighting matrix for high frequency component is large, when the current scanning is a high frequency component, small values (including "0") are often produced but large values are scarcely generated.

Therefore, the present invention proposes an adaptive variable-length coding/decoding method using a plurality of variable-length coding/decoding tables in which the block type (intra/inter mode), scanning position and quantization step size are combined, which is called a Huffman code book.

Figure 1:
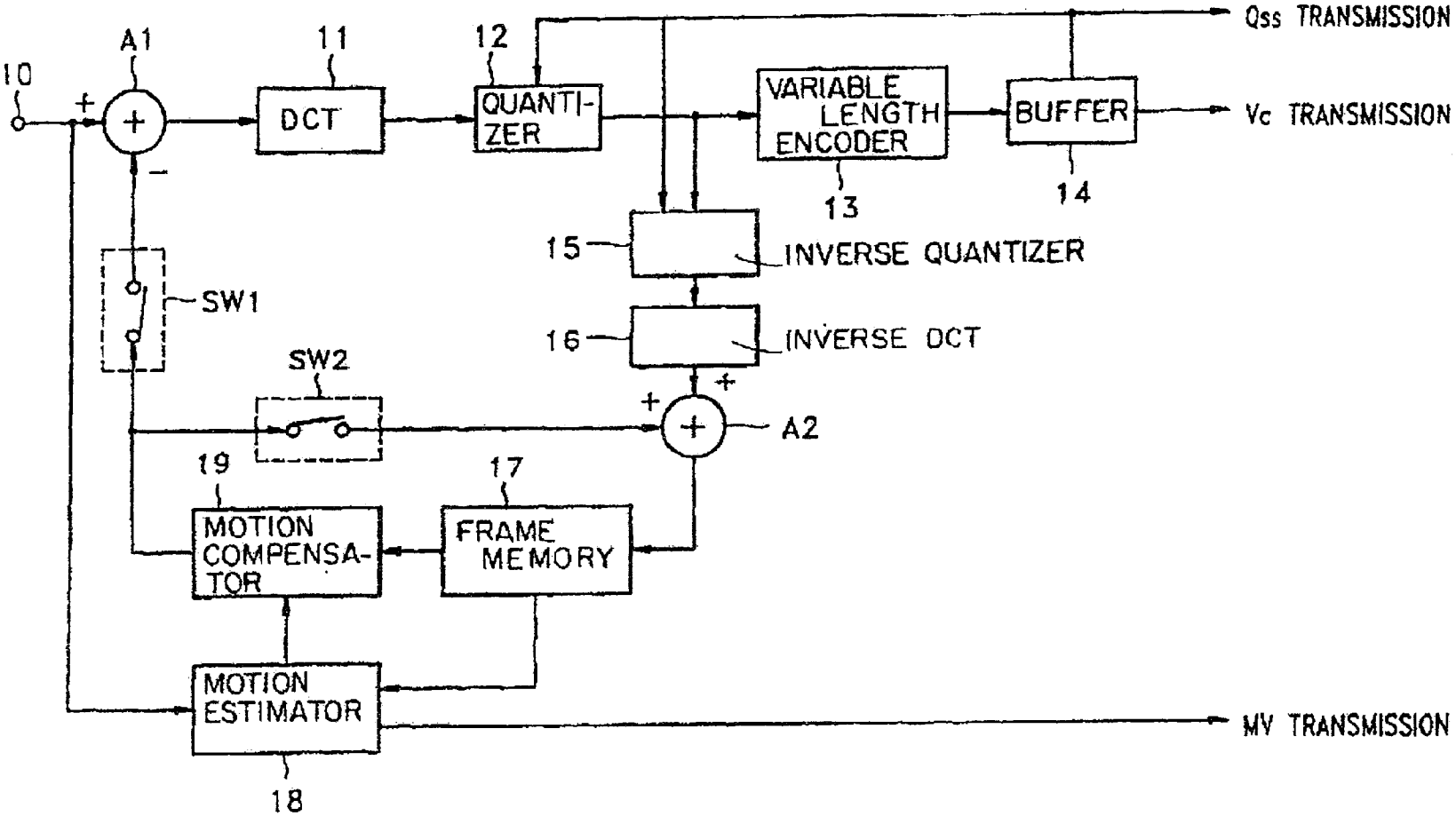
FIG. 1 is a block diagram of a general coding system for image data.
Figure 2:
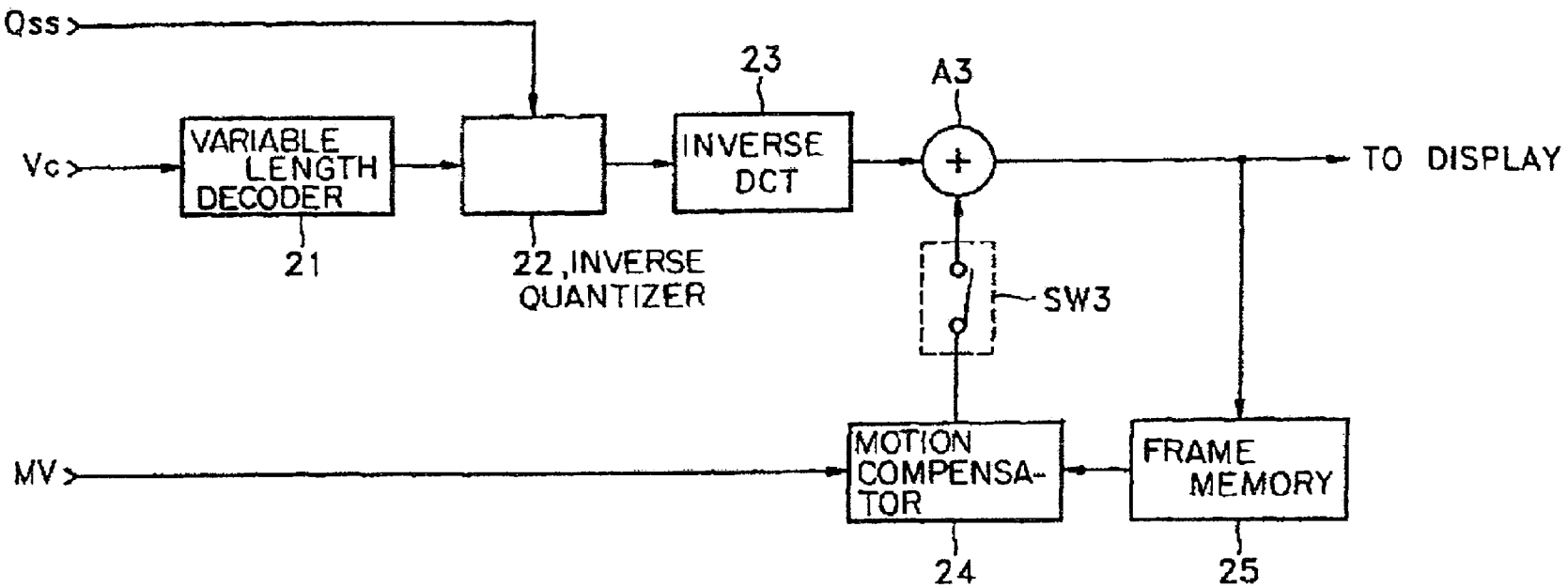
FIG. 2 is a block diagram of a general decoding system for image data.
Figure 3A:
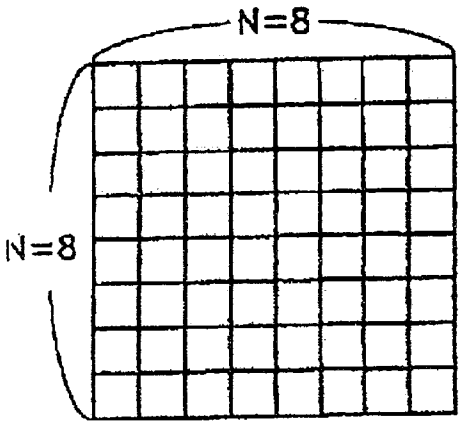
FIGS. 3A–3C are schematic diagrams for explaining steps of the data processing process according to the apparatus shown in FIG. 1.
Figure 3B:
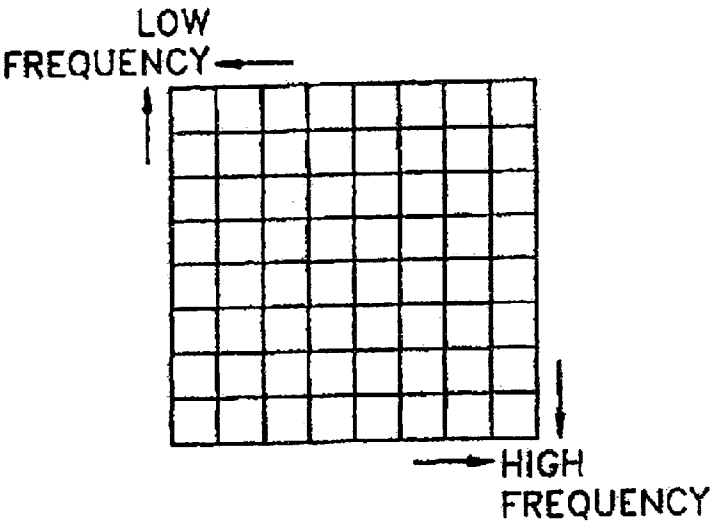
Figure 3C:
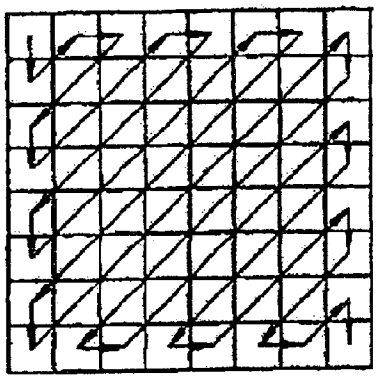

Also, the present invention is adopted for a general coding system shown in FIG. 1 and for a general decoding system shown in FIG. 2.

Figure 5:
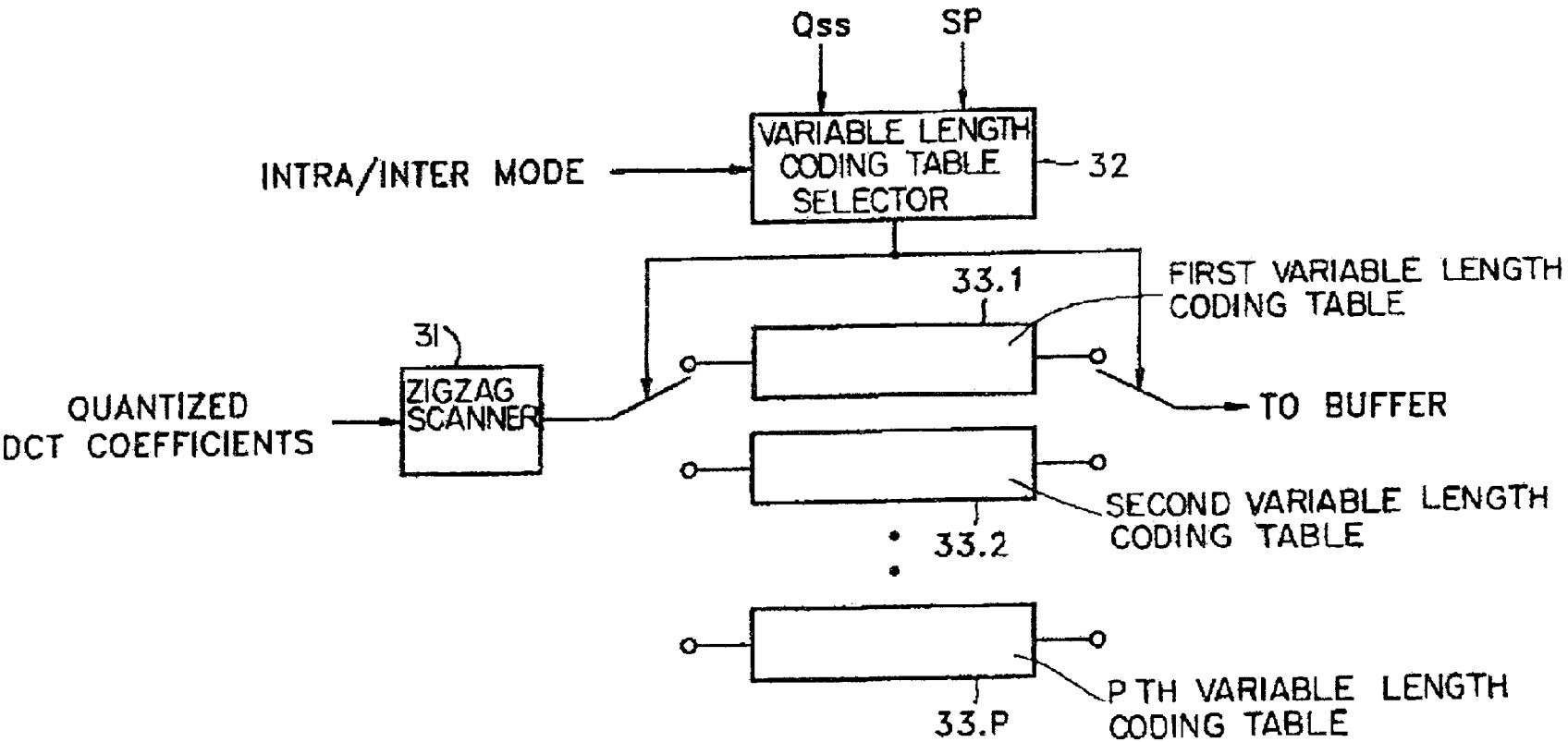
FIG. 5 is a schematic block diagram of a variable-length encoder for implementing an adaptive variable-length coding method according to the present invention.

FIG. 5 is a schematic block diagram of a variable-length encoder for implementing the adaptive variable-length coding method according to the present invention.

According to FIG. 5, quantized DCT coefficients are scanned in a zigzag pattern by zigzag scanner 31.

Variable-length coding table selector 32 outputs a control signal for selecting the corresponding first to Pth variable-length coding tables 33.1, 33.2, . . . , 33.P according to the block type (intra/inter mode), quantization step size $Q_{SS}$, and scanning position SP.

The quantized DCT coefficients output from zigzag scanning 31 are variable-length-coded in accordance with the selected variable-length coding table, to then be transmitted to buffer 14 shown in FIG. 1.

Variable-length decoder 21 of the decoding system shown in FIG. 2 variable-length-decodes data coded in the reverse order to that of the variable-length coding process as shown in FIG. 5.

Subsequently, the method for selecting a plurality of variable-length coding/decoding tables will be described in detail with reference to FIGS. 6A, 6B and 7A to 7C.

Figure 6B:
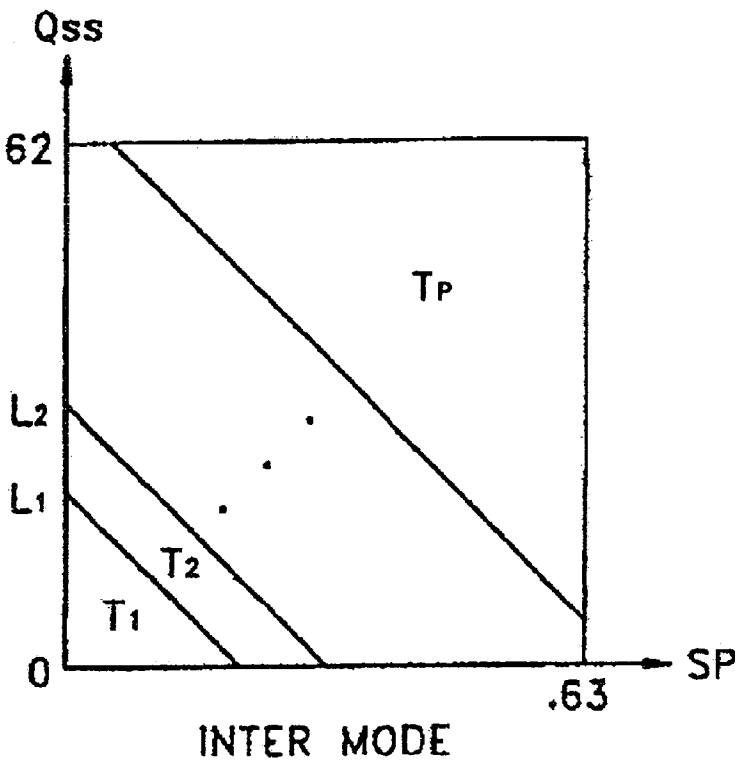
Figure 6A:
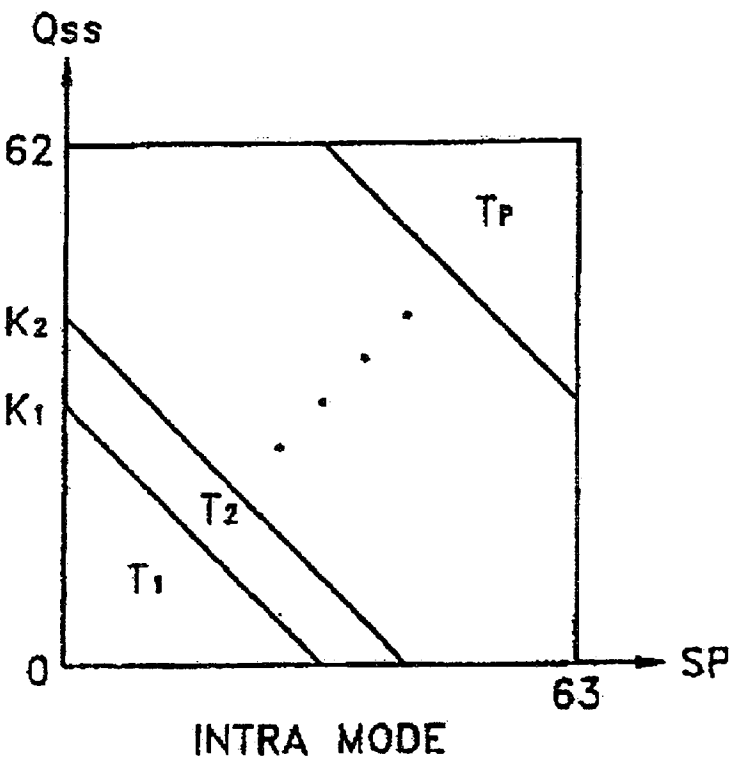

FIG. 6A shows P variable-length coding tables $T_1, T_2, \ldots, T_p$ selected in accordance with quantization step size $Q_{SS}$ and the current scanning position SP (during zigzag scanning) for the intra mode. FIG. 6B shows P variable-length coding tables $T_1, T_2, \ldots, T_p$ selected in accordance with quantization step size $Q_{SS}$ and the current scanning position SP (during zigzag scanning) for the inter mode.

The "0" scanning position SP corresponds to the DC component, the "63" scanning position SP represents the last scanning position in the corresponding block, and quantization step size $Q_{SS}$ has values ranging from "0" to "62."

First, in order to select one of P variable-length coding tables $T_1, T_2, \ldots, T_p$, it is determined whether the currently process block mode is an inter mode or intra mode.

That is to say, as shown in FIGS. 6A and 6B, the blocks for selecting the variable-length coding tables $T_1, T_2, \ldots, T_p$ are different depending on the mode. In other words, compared to the inter mode, the intra mode has larger selection blocks for the first and second variable-length coding tables $T_1$ and $T_2$ and a smaller selection block for the Pth variable-length coding table $T_p$.

In the determined mode, the first, second or Pth variable-length coding table $T_1$, $T_2$ or $T_p$ are selected in accordance with quantization step size $Q_{SS}$ and scanning position SP.

Quantized DCT coefficients are variable-length-coded in accordance with the selected variable-length coding table.

Here, an example of P regions partitioned on a (SP, $Q_{SS}$) plane in accordance with intra and inter modes shown in FIGS. 6A and 6B can be expressed as follows.

In the intra mode:

region 1: $SP+Q_{SS}<K_1$;

region 2: $K_1 \leqq SP+Q_{SS}<K_2$; and region P: $K_p-1 \leqq SP+Q_{SS}<K_p$In the inter mode:

region 1: $SP+Q_{SS}<L_1$;

region 2: $L_1 \leqq SP+Q_{SS}<L_2$; and region P: $L_p-1 \leqq SP+Q_{SS}<L_p$

The proper partition as above can be sought empirically based on sufficient statistical analysis for various experimental states. These states include each factors as video sequence, bit rate, GOP and partitioning method.

Figure 7A:
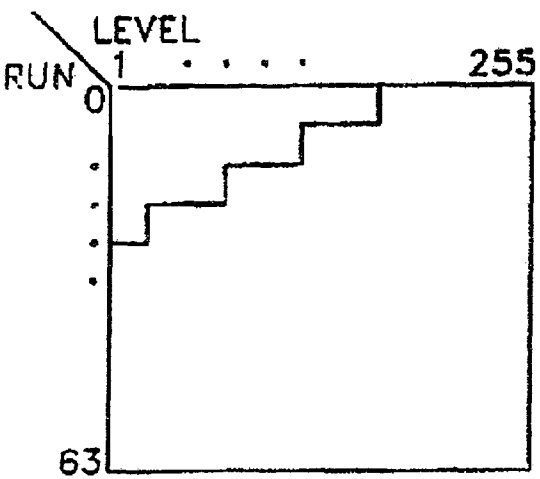
FIGS. 7A, 7B and 7C are histograms [run, level] for each symbol at the first, second and Pth regions shown in FIGS. 6A and 6B.
Figure 7B:
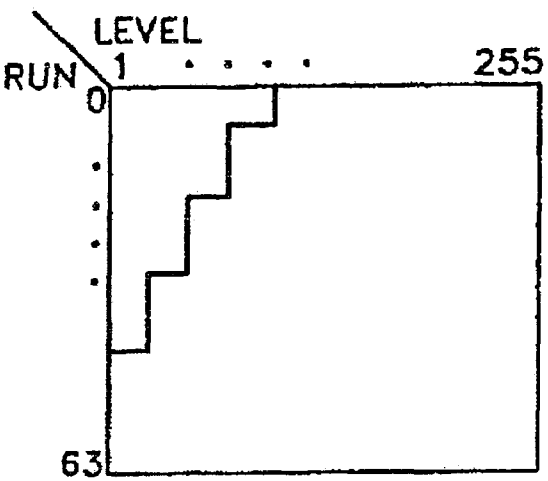
Figure 7C:
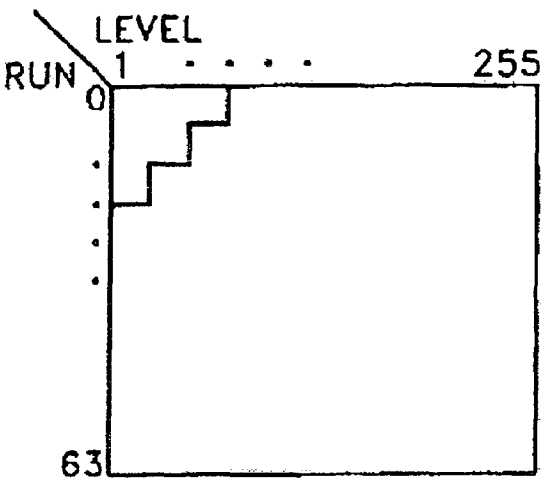

FIGS. 7A, 7B and 7C show examples of the variable-length coding tables shown in FIGS. 6A and 6B.

The variable-length coding tables have a regular region and escape region which differ depending on the statistical characteristics of [run, level].

That is to say, the first, second, . . . , Pth tables $T_1$, $T_2$, . . . , $T_p$ have the regular region and escape region having different patterns and the Pth table $T_p$ has a smaller regular region than that of the first or second tables $T_1$ or $T_2$.

Figure 4:
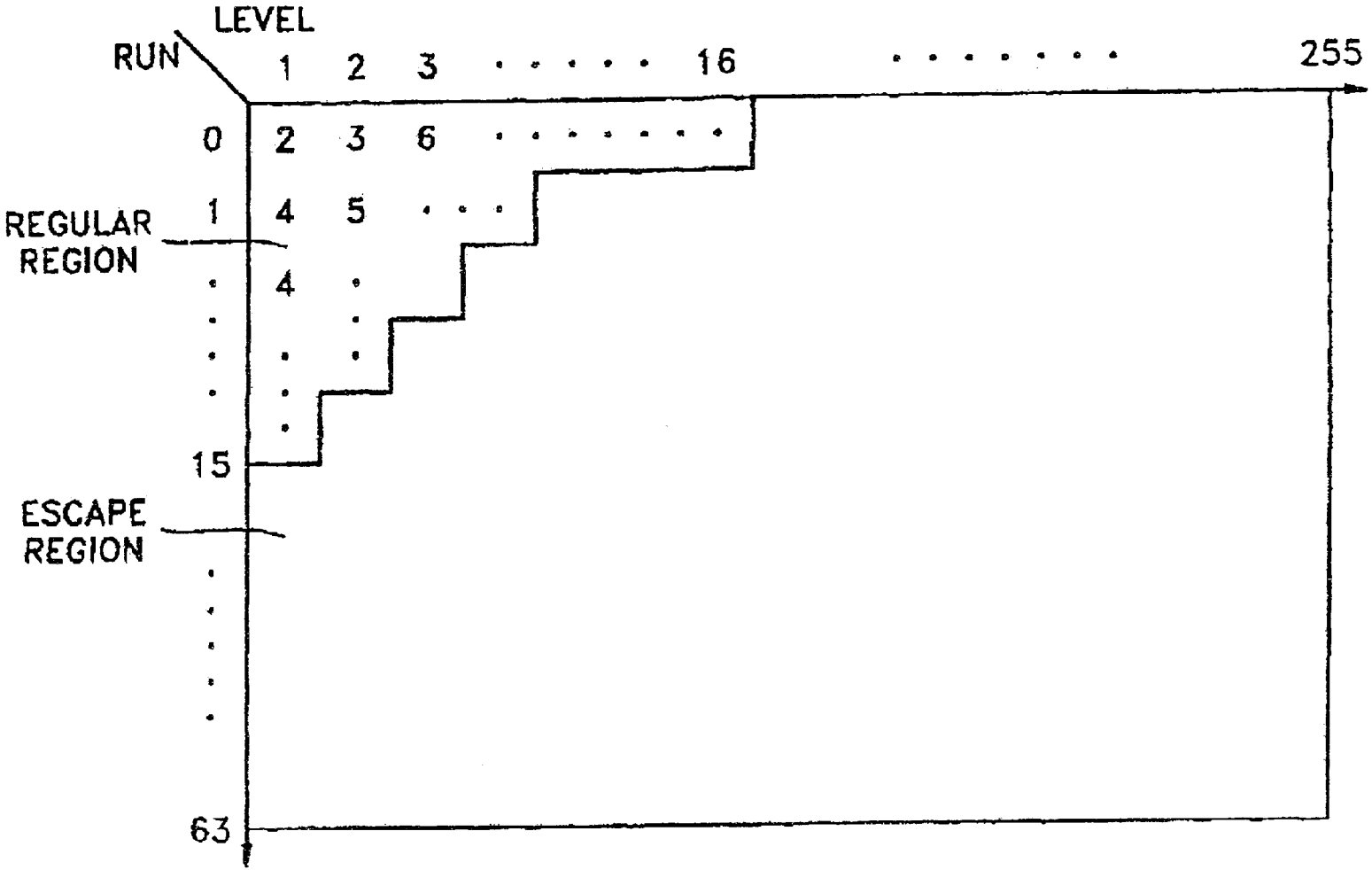
FIG. 4 shows a conventional variable-length coding and decoding table.

Meanwhile, the [run, level] symbol is likely to have a low probability thereof if the run and/or level lengths have a large value. As shown in FIG. 4, the respective symbols of the escape region has a fixed length of 21 bits obtained by adding a six-bit escape code, an eight-bit run, one-bit sign data.

However, in escape coding, since there is redundancy in the run and level fields, the data quantity may be reduced. That is to say, the bit number required for expressing run is dependent on the scanning position during zigzag scanning for two dimensional DCT coefficients and the bit number required for expressing level is dependent on the quantization step size. Also, quantization weighting matrices of intra-coded blocks and inter-coded blocks are different from each other.

The new escape sequence ESQ having a fixed length of 21 bits can be modified into that having a variable length using the aforementioned characteristics according to Equation (1) above, where ESQ is composed of six bits, RUN is composed of zero to six bits, L is composes of one to eight bits, S is composed of one bit, the run data is dependent upon scanning position, and the level is dependent upon quantizer.

Therefore, since the modified escape sequence has a variable length ranging from eight to 21 bits, compared to the fixed length of 21 bits, image data can be further compressed.

In decoding the new escape sequence, since the respective current scanning positions are automatically matched for the coding system and decoding system, the number of bits required for expressing the run value can be matched without transmitting extra information. Also, in the case of the level length, since the quantization step size is transmitted to the decoding system for inverse quantization, the transmitted quantization step size can be used in synchronizing the number of bits required for expressing level, which requires no extra information to be transmitted.

The above-described variable-length coding and decoding methods which improve compression efficiency by adjusting the length of the escape sequence variably are disclosed in the U.S. pat. application Ser. No. 08/069,914 filed on Jun. 1, 1993 by the assignee of the present invention.

According to the present invention, a plurality of variable-length tables are provided for both the coding and decoding sides, which may be slightly more complex in hardware, compared to the case of using a conventional single table. However, the present invention is adopted for the case when a high data compression rate is necessary. Also, the corresponding mode, quantization step size and scanning position information generated in coding side is transmitted to the decoding side. The mode and quantization step size information is transmitted in a constant period of time or is transmitted whenever there is a change. The scanning position information is not transmitted separately but is obtained automatically by accumulating the run values after obtaining [run, level] values of the decoding side.

Therefore, although the information on the selected variable-length coding table is not transmitted separately with respect to the block data transmitted to the decoding side, the variable-length coding table selected during coding can be identified from the mode and quantization step size information transmitted from the coding side and the position information automatically calculated from the run value in the decoding side. Then, the same variable-length coding table as that adopted for coding is used for decoding the transmitted block data.

As described above, the method according to the present invention can increase data components efficiency such that image data coded and decoded by selecting one of a plurality of variable-length coding tables having a regular region and an escape region, using mode, quantization step size and zigzag scanning position information.

Also, according to the present invention, no extra bit which expresses the variable-length coding table selected during coding is necessary to be transmitted for decoding. The transmission data can be further compressed by adjusting variably the run and level lengths of the data to be coded in the escape region of the selected variable-length coding table.

Industrial Applicability

An adaptive variable-length coding/decoding method according to the present invention can improve the compression efficiency of digitally transmitted data and is applicable to various technological fields including digital communication, multimedia and personal computer systems, and digital video apparatuses such as a high definition television or digital videocassette recorder.

What is claimed is:

[1. An adaptive variable-length coding method whereby quantized orthogonal transform coefficients are scanned in a zigzag pattern, are modified into run, level data and then are variable-length coded in a coding system for image data, said method comprising the steps of:

setting a plurality of variable-length coding tables having different patterns of a regular region and an escape region according to statistical characteristics of said run, level data;

selecting one of said plurality of variable-length coding tables according to intra/inter mode information of the currently processed block, zigzag scanning position and quantization step size; and variable-length coding the orthogonal transform coefficients according to said selected variable-length coding table, wherein said selecting step has the selecting range of a plurality of variable-length coding tables having different patterns of a regular region and an escape region according to said intra/inter mode information of the currently Processed block.]

[2. The adaptive variable-length coding method as claimed in claim 1, wherein said variable-length coding table is selected in accordance with said zigzag scanning position and quantization step size within the range determined by the corresponding mode.]

[3. The adaptive variable-length coding method as claimed in claim 1, wherein data of said escape region of said variable-length coding table selected in said variable-length-coding step is coded into data having variable run-length and level-length.]

[4. An adaptive variable-length decoding method for decoding the data coded by said adaptive variable-length coding method as claimed in claim 1, in a decoding system for image data, said decoding method comprises the steps of:

setting a plurality of variable-length decoding tables having different patterns of a regular region and an escape region according to statistical characteristics of the run, level data;

inputting intra/inter mode information transmitted from said coding system;

inputting quantization step size transmitted from said coding system;

detecting position information while zigzag-scanning by accumulating run values of run, level data;

selecting one of said plurality of variable-length coding tables according to said intra/inter mode information, quantization step size and position information; and variable-length decoding the data received according to said selected variable-length coding table.]

[5. The adaptive variable-length decoding method as claimed in claim 4, wherein said variable-length decoding table selecting step has the selection range of a plurality of variable-length coding tables having different patterns of a regular region and an escape region according to said intra/inter mode information of the currently processed block in said mode information inputting step.]

[6. The adaptive variable-length decoding method as claimed in claim 5, wherein said variable-length decoding table is selected in accordance with said zigzag scanning position and quantization step size within the range determined by the corresponding mode.]

[7. The adaptive variable-length decoding method as claimed in claim 4, wherein data of said escape region of said variable-length decoding table selected in said variable-length-decoding step is decoded into run, level data corresponding to variable run-length and level-length.]

*8. An adaptive variable-length decoding method for decoding image data encoded by an adaptive variable-length coding method, in which quantized orthogonal transform coefficients of the image data are scanned in a predetermined pattern and encoded, the decoding method comprising:*

*selecting one of a plurality of variable-length decoding tables at least according to intra/inter mode information and scanning position, wherein the plurality of variable-length decoding tables comprise:*

*a table selectable for an alternating-current (AC) component of an intra mode that is different from a table selectable for an inter mode; and*

*a table selectable for a direct-current (DC) component of said intra mode, and*

*the table for the DC component comprising variable-length codes further selectable according to the DC component that has been quantized by a quantization step size; and*

*variable-length decoding the encoded quantized orthogonal transform coefficients according to the selected variable-length decoding table.*

*9. The adaptive variable-length decoding method of claim 8, wherein the variable-length decoding tables have different patterns of a regular region and an escape region.*

*10. The adaptive variable-length decoding method of claim 9, wherein data of the escape region of the selected variable-length decoding table is decoded into data having variable or fixed run-length and level-length.*

* * * * *